United States Patent
Lopatin et al.

(10) Patent No.: US 6,174,799 B1
(45) Date of Patent: Jan. 16, 2001

(54) GRADED COMPOUND SEED LAYERS FOR SEMICONDUCTORS

(75) Inventors: Sergey D. Lopatin, Santa Clara; Takeshi Nogami, Sunnyvale, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/225,649

(22) Filed: Jan. 5, 1999

(51) Int. Cl.[7] .................................................. H01L 21/24
(52) U.S. Cl. ........................ 438/627; 438/643; 438/650; 438/653
(58) Field of Search .................................. 438/627, 629, 438/643, 650, 653, 659, FOR 355

(56) References Cited

U.S. PATENT DOCUMENTS

| | | | |
|---|---|---|---|
| 5,389,575 | * | 2/1995 | Chin et al. . |
| 5,656,546 | * | 8/1997 | Chen et al. . |
| 5,899,740 | * | 5/1999 | Kwon . |
| 6,015,749 | * | 1/2000 | Liu et al. . |
| 6,027,990 | * | 2/2000 | Thakur et al. . |
| 6,046,059 | * | 4/2000 | Shen et al. . |
| 6,046,108 | * | 4/2000 | Liu et al. . |

* cited by examiner

*Primary Examiner*—George Fourson
*Assistant Examiner*—Joannie A. Garcia
(74) *Attorney, Agent, or Firm*—Mikio Ishimaru

(57) ABSTRACT

A method is provided for forming semiconductor copper seed layers with the copper alloyed with one of the metals from the group comprising tin, magnesium, and aluminum. The alloy further has a graded nitrogen content with the highest concentration of nitrogen proximate a tungsten nitride barrier layer. The high concentration of nitrogen in the copper alloy provides good adhesion of the seed layer to the barrier layer while the lack of nitrogen away from the barrier layer allows the copper conductive to have good adhesion with the pure copper conductive material.

6 Claims, 2 Drawing Sheets

GRADED COMPOUND SEED LAYERS FOR SEMICONDUCTORS

TECHNICAL FIELD

The present invention relates generally to semiconductors and more specifically to seed materials used in semiconductor processing.

BACKGROUND ART

In the process of manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by a electroplating of the conductive material on the seed layer in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), titanium nitride (TiN), or tungsten nitride (WN) are used as barrier materials for copper. A thin adhesion layer formed of an adhesion material, such as the unnitrided form of the barrier material, is often first deposited on the dielectrics or vias to ensure good adhesion and good electrical contact of the subsequently deposited seed layers to underlying doped regions and/or conductive channels. Adhesion/barrier layer stacks formed of adhesion/barrier materials such as tantalum/tantalum nitride (Ta/TaN), titanium/titanium nitride (Ti/TiN), or just tungsten nitride (WN) have been found to be useful as adhesion/barrier material combination for copper interconnects.

The difficulty with nitride-containing barrier materials is that conductive materials such as copper often do not have good adhesion with these materials. With poor adhesion, there is a greater likelihood of electro-migration of the conductive material under load and the formation of voids which can cause increased resistance or open circuit failures.

Thus, a solution which would allow good adhesion of the copper seed to the barrier layer while providing a high conductive surface for following electroplating of conductive material has long been sought, but has eluded those skilled in the art. As the semiconductor industry moves from aluminum to copper and other types of materials with greater electro-conductivity and diffusiveness through dielectrics, it has become more pressing that a solution be found.

DISCLOSURE OF THE INVENTION

The present invention provides a method for forming semiconductor seed layers of graded conductor alloys with barrier layer elements to provide good adhesion of the conductive layer to the barrier layer.

The present invention provides a method for forming seed layers of conductive metal alloyed with one of the metals including tin, magnesium, and aluminum with various concentrations of nitrogen.

The present invention provides a method for forming seed layers of conductive metal alloyed with one of the metals including tin, magnesium, and aluminum with the highest concentration of nitrogen proximate the barrier layer.

The present invention provides a method for forming semiconductor copper seed layers with the copper alloyed with one of the metals from the group comprising tin, magnesium, and aluminum. The alloy further has a graded nitrogen content with the highest concentration of nitrogen proximate the tungsten nitride barrier layer. The high concentration of nitrogen in the copper alloy provides good adhesion of the seed layer to the barrier layer while the lack of nitrogen distal from the barrier layer allows the copper conductive to have good adhesion with the pure copper conductive material.

The present invention provides for good adhesion for the seed layer both for the barrier layer and the conductive layer.

The present invention further provides a seed layer having good adhesion to both the barrier layer and the conductive layer so as to decrease electro-migration.

The above and additional advantages of the present invention will become apparent to hose skilled in the art from a reading of the following detailed description when taken in conjunction with the accompanying drawings.

BEST MODE FOR CARRYING OUT THE INVENTION

Figure 1A:
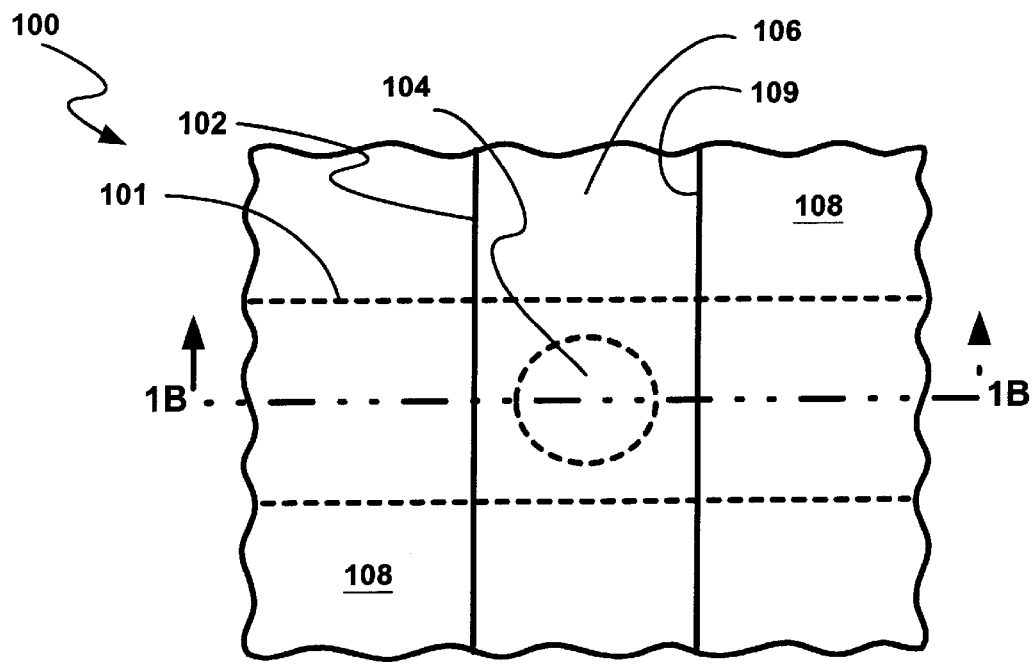
FIG. 1A (PRIOR ART) is a plan view of aligned channels with a prior art via.

Referring now to FIG. 1A (PRIOR ART), therein is shown a plan view of a prior art pair of perpendicularly aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material. The second channel opening 106 is defined by walls (sidewalls) 109 of second oxide layer 108.

Figure 1B:
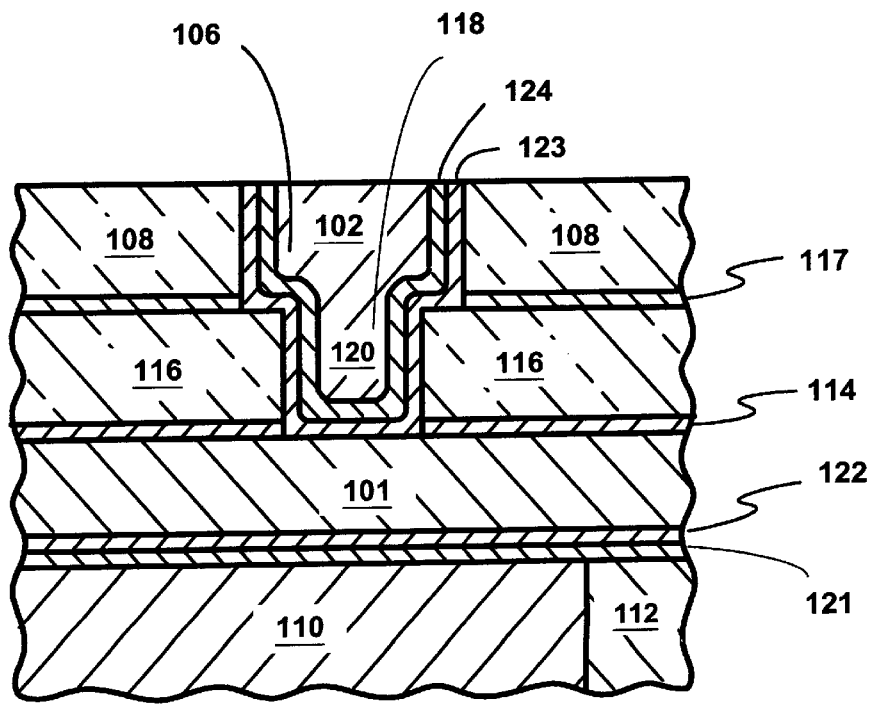
FIG. 1B (PRIOR ART) is a cross-section of FIG. 1A (PRIOR ART) along line 1B—1B.

Referring now to FIG. 1B (PRIOR ART), therein is shown a cross-section of FIG. 1A (PRIOR ART) along 1B—1B. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1A (PRIOR ART) defines a cylindrical via 120 when it is filled with the second conductive material.

Also shown disposed around the first channel 101 are a barrier layer 121 and a seed layer 122, and around the second channel 102 and the cylindrical via 120 is a barrier layer 123 and a seed layer 124. The seed layers 122 and 124 need to have good adhesion with the barrier layers 121 and 123, respectively, and with the conductive material in the channels 1010 and 102 and in the via 120. Adhesion is important in the via areas where the current density is high because the cross-sectional area is low. With poor adhesion, electro-migration will occur under loading due to current flow which will cause voids to form in the conductive material. Over time these voids grow until the resistance increases in areas such as the via 120 or an actual open circuit occurs.

Figure 2:
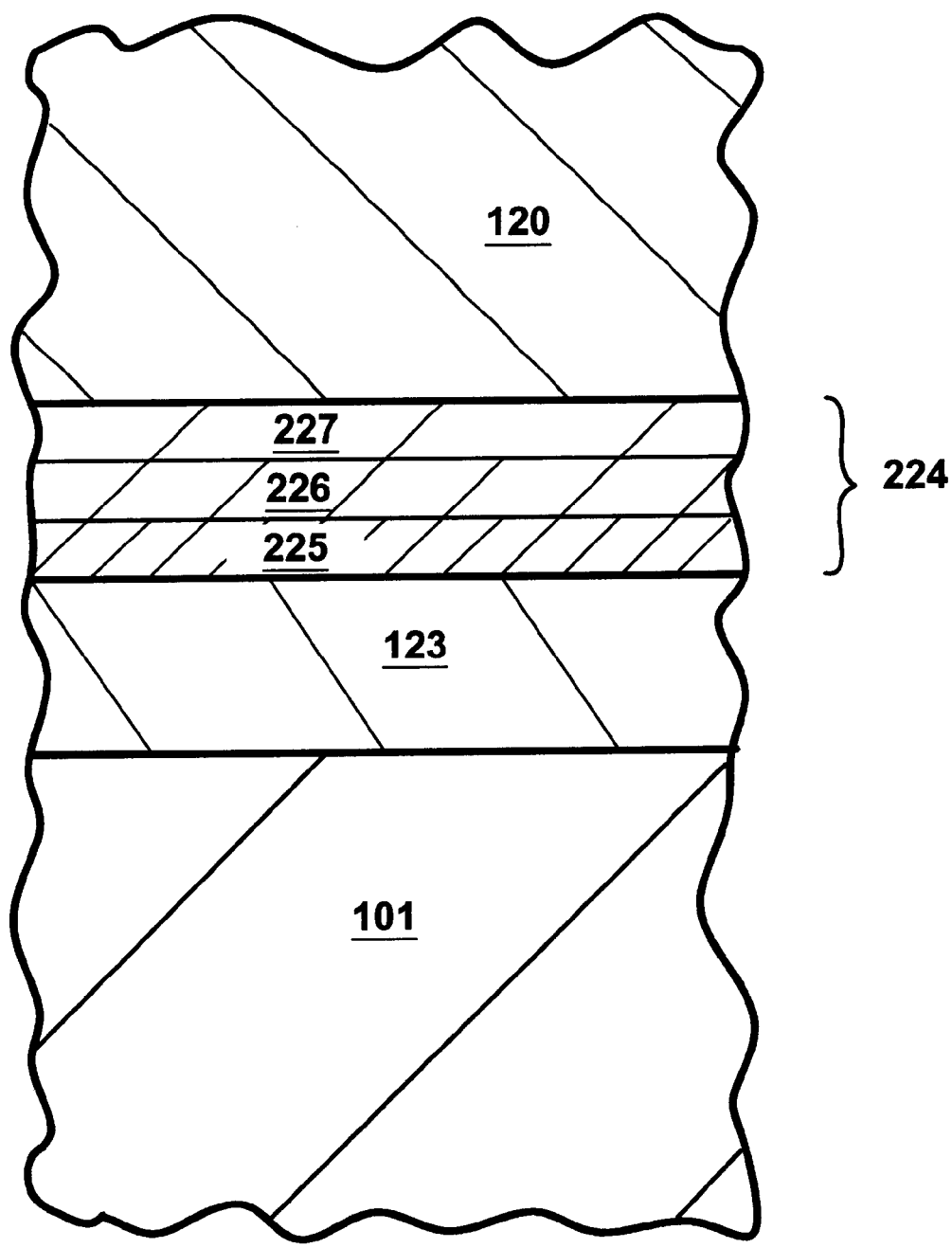
FIG. 2 is a close-up section of the area of the seed barrier of the present invention.

Referring now to FIG. 2, therein is shown the conductive material in the channel 101 and the via 120. Disposed on the conductive material is the barrier layer 123. As previously described, the barrier layer 123 can be an adhesion/barrier layer stack of a refractory metal or a nitridied refractory metal. Such materials are tantalum/tantalum nitride, titanium/titanium nitride, or tungsten nitride.

As seed layer 224 is shown deposited on the barrier layer 123. The seed layer 224 may be deposited by a number of conventional processes such as physical vapor deposition, ion metal plasma and hollow cathode magnetron metalization. In the present invention, the conductive material will be alloyed with a metal which forms a good bond with the barrier material, such as nitrogen, so the conductive material will be alloyed to a barrier, or nitrided, alloyed material. In the preferred embodiment, the preferred conductive material would be copper and the nitrided alloys would be tin nitride (SnN), magnesium nitride (MgN), or aluminum nitride (AlN).

In the preferred embodiment, the seed layer 224 is thus made up of a compound of copper alloyed with a highly nitrided tin to form the nitrided portion 225 (CuSnN) of the seed layer 224. As the deposition of the copper—tin alloy continues, the nitrogen concentration is decreased to form a lower-graded nitrogen concentration portion 226 (CuSnN) of the seed layer 224. Towards the end of the deposition of the alloy, the nitrogen is reduced to zero so as to form the nitrogen-free region 227 (CuSn) of the seed layer 224.

When deposition of the nitrogen-free region 227 is complete, the seed layer 224 is used as an electrode for the electroplating of copper conductive material into the channel 120.

Thus, a graded, compound seed layer is provided which would generally have the chemical composition of Cu (Sn, Mg, or Al) N which goes to Cu (Sn, Mg, or Al).

In production, a first damascene process is used to put down the first channel 101 in a first channel oxide layer (not shown) above portions of a semiconductor wafer (not shown). The damascene process is a photolithographic process which uses a mask to define a first channel opening (not shown) in the first channel oxide layer. The first channel opening is then filled with a first conductive material, such as copper, to form the first channel 101 using conventional metal deposition technique, such as physical vapor deposition, chemical vapor deposition, electroplating, or a combination thereof. The stop nitride layer 114, the via oxide layer 116, and the via nitride layer 117 would be successively deposited on top of the first channel 201 and the first channel oxide layer using conventional deposition technique.

By using the via photoresist and the via photolithographic process followed by nitride etching of a round via opening 104 in the via nitride layer 117, the basis for the cylindrical via 118 was formed. The subsequent deposition of the second channel oxide layer 108 prepared the way for the second channel 106 to be perpendicular to the first channel 101.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 1B than in the horizontal direction. The nitride etch of the stop nitride layer 114 exposes a portion of the first channel 101 and completes the etching steps.

Next, a thin barrier layer (not shown) is deposited in the second channel opening 106 and the cylindrical via opening 118, including along the walls of the second channel opening 106 and the cylindrical via opening 118. The thickness of the barrier material is insufficient to fill the second channel opening 106 and the cylindrical via opening 118. Examples of suitable adhesion materials include the nitrides of the refractory metals such as titanium, tantalum, and tungsten. The barrier layer is deposited using conventional deposition techniques, such as physical vapor deposition, chemical vapor deposition, or a combination thereof.

Thereafter, the thin, first seed layer 224 is deposited on the barrier layer in the second channel opening 106 and the cylindrical via opening 118. Again, the thickness of the seed layer 224 is insufficient to fill the second channel opening 106 and the cylindrical via opening 118. The seed layer 224 is deposited using physical vapor deposition, ion implantation, or hollow cathode metalization.

The seed layer 224 could be a copper tin nitride (CuSnN) which becomes a pure copper tin (CuSn), copper magnesium nitride (CuMgN) which becomes copper magnesium (CuMg), or copper aluminum nitride (CuAlN) which becomes copper aluminum (CuAl). The concentration of nitrogen is controlled during the deposition process by controlling the deposition in an atmosphere which is originally high in nitrogen and then successively replace the nitrogen with an inert gas.

Next, the second conductive material is deposited into second channel opening 106 and via opening 118 using conventional metal deposition technique, such as physical vapor deposition, chemical vapor deposition, electroplating, or a combination thereof. Thereafter, a chemical mechanical polishing process is used to complete the conventional connection process similar to what were shown and described for FIGS. 1A and 1B.

Accordingly, a graded compound seed layer for semiconductors is provided which has good adhesion to the barrier layer as well as the conductive layer. This graded nitrogen containing alloy, or compound, substantially decreases electro-migration.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention. In addition, while the embodiments of the present inventions form a seed layer in a channel opening and a via opening atop another conductive channel, it should be understood that the present invention is applicable to forming a seed layer in a channel opening and/or a via opening atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor comprising:

a semiconductor substrate;

a dielectric layer disposed over said semiconductor substrate having an opening provided therein;

a barrier layer disposed in and lining said opening;

a seed layer disposed over said barrier layer having a conductive metal alloyed with a nitrided metal; and a conductive layer over said seed layer sufficient to fill said opening.

2. The method as claimed in claim 1 wherein said seed layer has a concentration of nitrogen which reduces to zero adjacent to the top surface thereof.

3. The method as claimed in claim 1 wherein said seed layer is formed with a process selected from a group consisting of physical vapor deposition, ion implantation, and hollow cathode metalization.

4. The method as claimed in claim 1 wherein said barrier layer is a material selected from a group consisting of titanium, tantalum, tungsten, titanium nitride, tantalum nitride, tungsten nitride, an alloy thereof, and a compound thereof.

5. The method as claimed in claim 1 wherein said seed layer is an alloying material selected from a group consisting of tin, magnesium, aluminum, an alloy thereof, and a compound thereof.

6. The method as claimed in claim 1 wherein said conductive layer is selected from a group consisting of aluminum, copper, gold, silver, and a compound thereof.

* * * * *